(12) United States Patent
Sakai

(10) Patent No.: US 10,581,185 B2
(45) Date of Patent: Mar. 3, 2020

(54) BOARD CONNECTOR

(71) Applicant: Sumitomo Wiring Systems, Ltd., Yokkaichi, Mie (JP)

(72) Inventor: Masami Sakai, Mie (JP)

(73) Assignee: Sumitomo Wiring Systems, Ltd. (JP)

(*) Notice: Subject to any disclaimer, the term of this patent is extended or adjusted under 35 U.S.C. 154(b) by 0 days.

(21) Appl. No.: 16/174,598

(22) Filed: Oct. 30, 2018

(65) Prior Publication Data

US 2019/0140378 A1  May 9, 2019

(30) Foreign Application Priority Data

Nov. 7, 2017 (JP) .................. 2017-214923

(51) Int. Cl.
*H01R 12/70* (2011.01)
*H01R 12/57* (2011.01)
*H01R 12/71* (2011.01)

(52) U.S. Cl.
CPC ......... *H01R 12/7029* (2013.01); *H01R 12/57* (2013.01); *H01R 12/716* (2013.01)

(58) Field of Classification Search
CPC ................................................. H01R 12/7029
See application file for complete search history.

(56) References Cited

U.S. PATENT DOCUMENTS

2007/0049124 A1* 3/2007 Chien .................. H01R 13/629
439/668
2017/0294725 A1 10/2017 Kang et al.

FOREIGN PATENT DOCUMENTS

JP        2017-191674        10/2017

* cited by examiner

*Primary Examiner* — Ross N Gushi
(74) *Attorney, Agent, or Firm* — Gerald E. Hespos; Michael J. Porco; Matthew T. Hespos

(57) ABSTRACT

A board connector includes a receptacle (11) fittable to a mating housing (100) and a fixing member (40) having a board fixing portion (42) to be fixed to a circuit board (90) and a receptacle fixing portion (41) connected to the board fixing portion (42) and to be fixed to the receptacle (11). The receptacle (11) includes a side wall (17) arranged on a plate surface of the circuit board (90) and extending along a rising direction from the plate surface. An opening (25) penetrates the side wall (17) in a wall thickness direction. The receptacle fixing portion (41) of the fixing member (40) is arranged along an opening surface of the opening (25).

10 Claims, 11 Drawing Sheets

F I G. 6
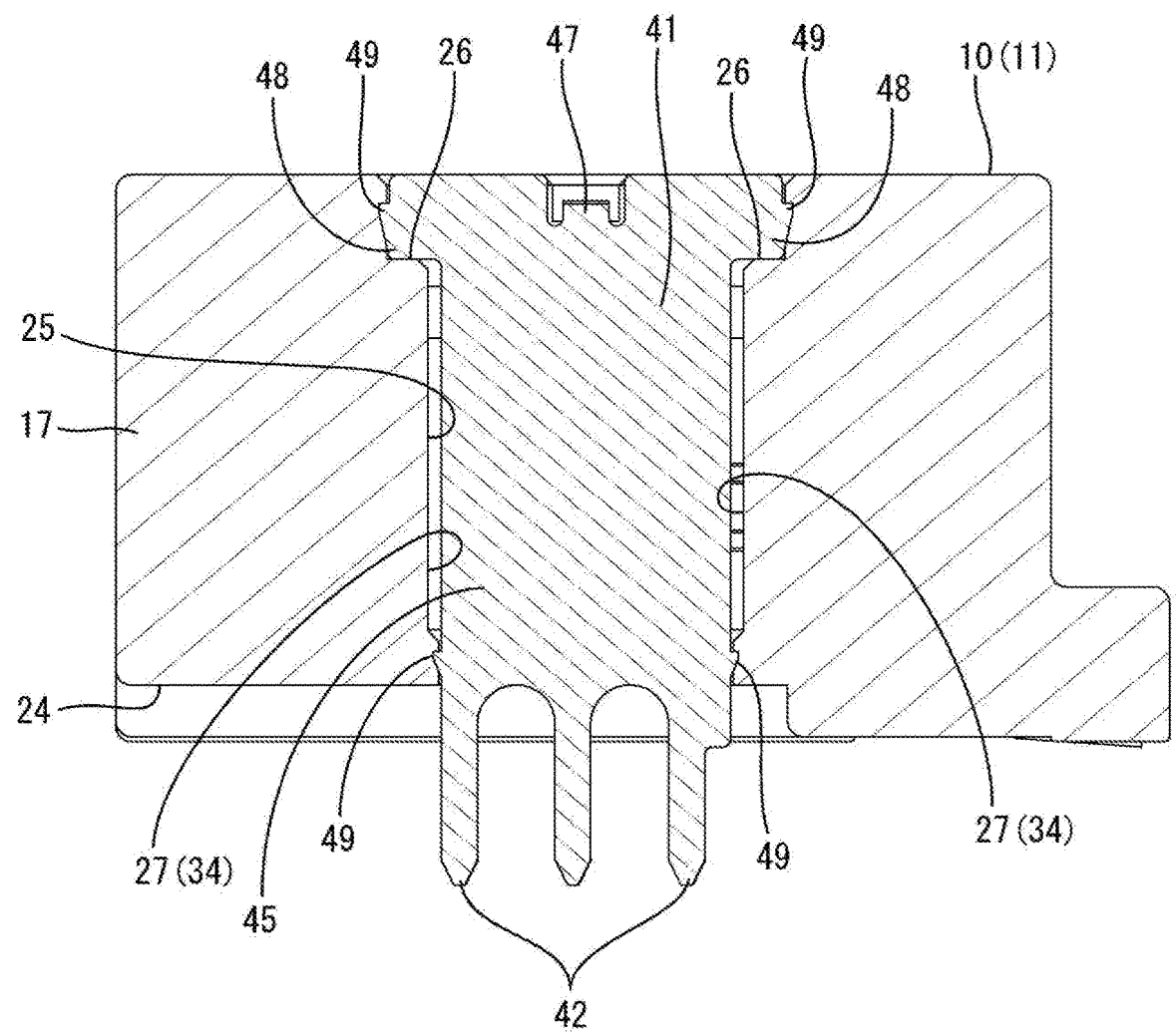

# BOARD CONNECTOR

BACKGROUND

Field of the Invention

The invention relates to a board connector.

Related Art

Japanese Unexamined Patent Publication No. 2017-191674 discloses a board connector with a tubular receptacle fittable to a mating connector and fixing members for fixing the receptacle to a circuit board. The receptacle includes two side walls extending along a rising direction from a plate surface of the circuit board, and mounting recesses are provided in the side walls for mounting the fixing members. The mounting recess is provided within a wall thickness between inner and outer side surfaces of the side wall. Thus, the mounting recesses do not enlarge the receptacle. However, a formation range of the mounting recess is restricted within the wall thickness of the side wall, and side wall parts that define the side surfaces of the mounting recess become thinner. Thus, if the side walls are thin in the first place, it may become difficult to form the side walls.

The invention was completed on the basis of the above situation and aims to provide a board connector that is easy to manufacture without enlarging the receptacle.

SUMMARY

The invention is directed to a board connector with a tubular receptacle that can fit to a mating housing. The receptacle includes a side wall arranged on a plate surface of a circuit board and extends along a rising direction from the plate surface. An opening penetrates through the side wall in a wall thickness direction. The side wall also has a fixing member including a board fixing portion to be fixed to the circuit board and a receptacle fixing portion connected to the board fixing portion and to be fixed to the receptacle in a state arranged along an opening surface of the opening.

Since the opening penetrates through the side wall in the wall thickness direction, no thin part needs to remain in the side wall. Thus, manufacturing is easy, and the side wall need not be thinned. Further, no part projects laterally from the side wall. Therefore, the receptacle need not be enlarged. More particularly, the receptacle fixing portion is arranged along the opening surface and does not project laterally from the side wall so that the entire board connector is not enlarged.

Receiving portions may be provided on both sides of the receptacle across the opening. The receptacle fixing portion may include a flat plate-shaped cover for covering the opening surface of the opening. Locks may be on both sides of the cover in a plate width direction and can be locked to the receiving portions. The cover prevents intrusion of foreign matter into the receptacle through the opening. Further, the receiving portions to be locked to the locking portions are provided on the both sides of the receptacle across the opening. Thus, locking structures for the locks can be formed reliably.

The lock may include a locking projection. The receiving portion may include a foreign matter capturing portion defined into a recess by a back wall surface configured such that the locking projection bites therein. An inner side wall surface covers an inner plate surface of the locking portion and an outer side wall surface covers an outer plate surface of the lock. The locking projection may bite into the back wall surface to shave the back wall surface and produce shavings. However, the produced foreign matter can be captured by the foreign matter capturing portion. Thus, foreign matter cannot intrude into the receptacle.

The receptacle may include an upper wall connected to a tip part in the rising direction of the side wall, a lock for holding the mating housing in a connected state may project inward on the upper wall, and the foreign matter capturing portions of the receiving portions may be provided on both sides across the lock. According to this configuration, spaces on both sides across the lock can be utilized as the foreign matter capturing portions of the receiving portions, and thus space efficiency is excellent. Further, a degree of freedom in forming the foreign matter capturing portions can be enhanced.

The receptacle may include a lower wall connected to a base end part in the rising direction of the side wall. An erroneous connection preventing portion for preventing erroneous connection to the mating housing may project in on the lower wall, and the foreign matter capturing portions of the receiving portions may be provided on both sides across the erroneous connection preventing portion. According to this configuration, spaces on both sides across the erroneous connection preventing portion can be utilized as the foreign matter capturing portions of the receiving portions so that space efficiency is excellent. Further, a degree of freedom in forming the foreign matter capturing portions can be enhanced.

The side wall may be provided with a bridge bridged between both side edge parts of the opening and capable of contacting an outer surface of the receptacle fixing portion. The bridge is arranged to contact the outer surface of the receptacle fixing portion. Thus, a lifting movement of the receptacle fixing portion away from the opening surface of the opening can be prevented. Further, the strength of the side wall can be ensured.

The bridge may be provided on a lower end part of the side wall on the circuit board side and may contact a part of the receptacle fixing portion on the board fixing portion side. According to this configuration, the part of the receptacle fixing portion on the board fixing portion side can be fixed to the bridge and the board fixing portion can be fixed to the circuit board with enhanced reliability.

The fixing member may extend linearly and continuously from the receptacle fixing portion to the board fixing portion. According to this configuration, the board fixing portion does not project laterally project from the side wall and an occupying area of the board connector on the plate surface of the circuit board can be made smaller.

BRIEF DESCRIPTION OF DRAWINGS

FIG. 6 is a section along a side wall of a receptacle of the board connector.

DETAILED DESCRIPTION

Figure 1:
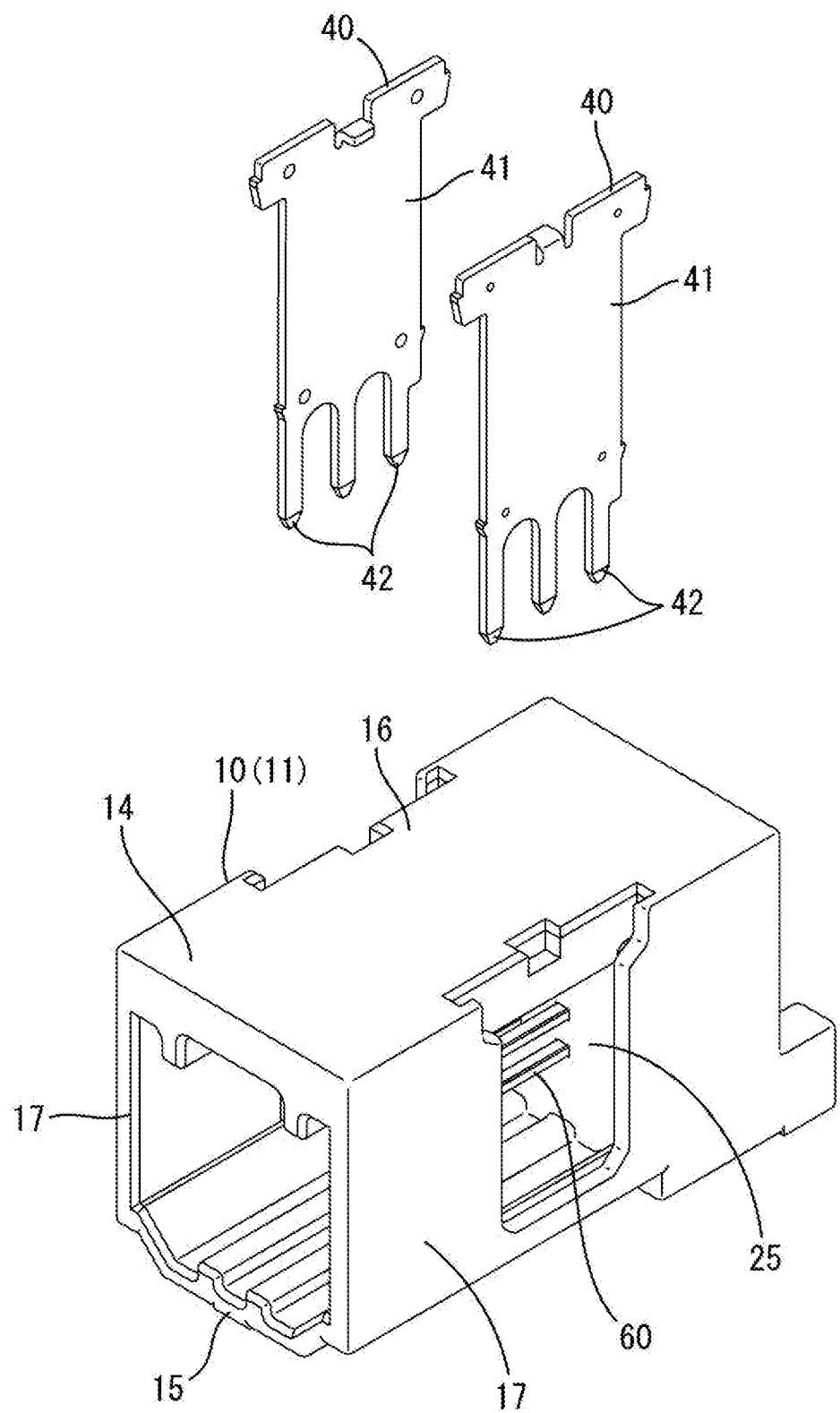
FIG. 1 is an exploded perspective view of a board connector according to one embodiment of the present invention.
Figure 5:
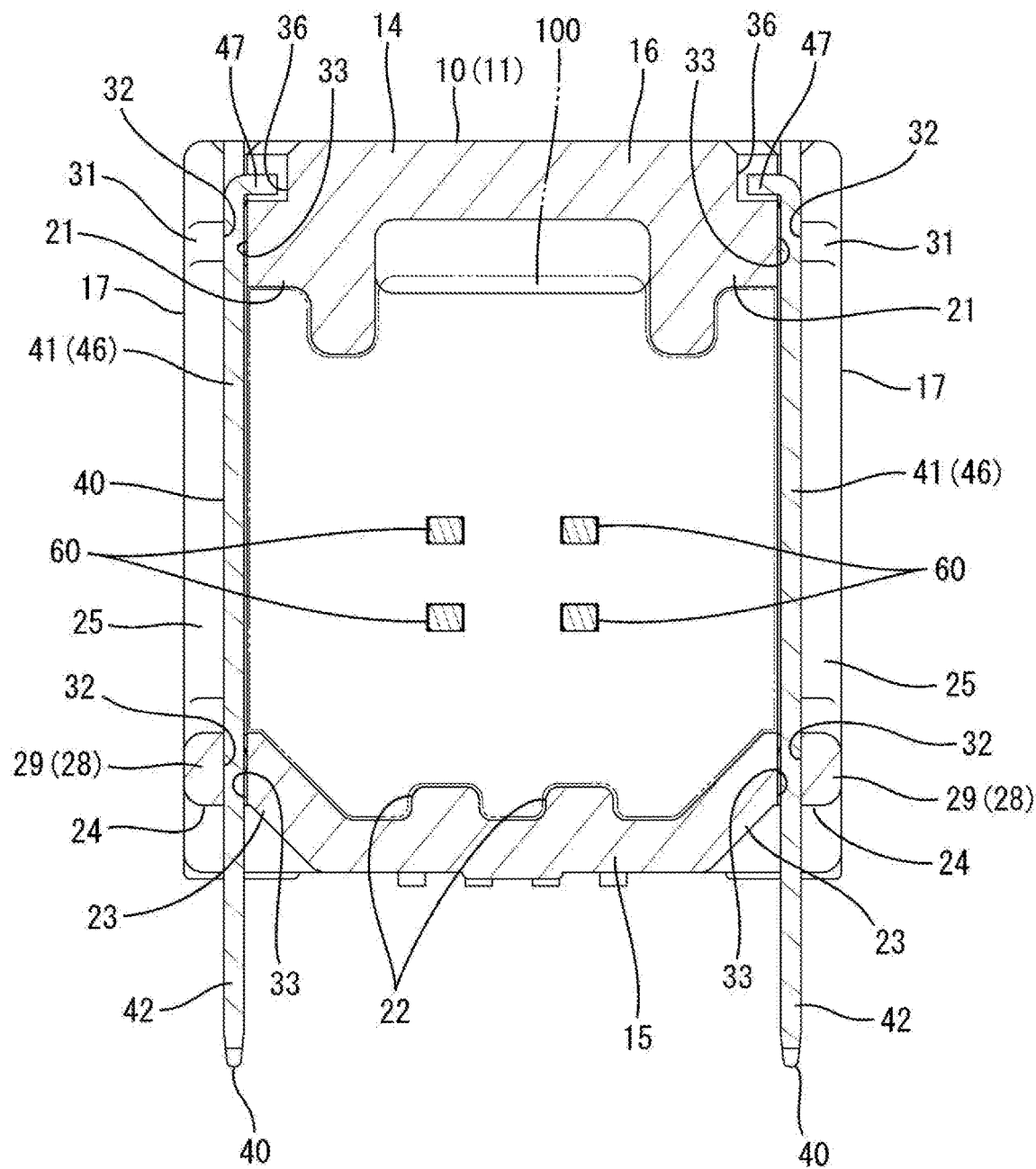
FIG. 5 is a section along A-A of FIG. 4.
Figure 7:
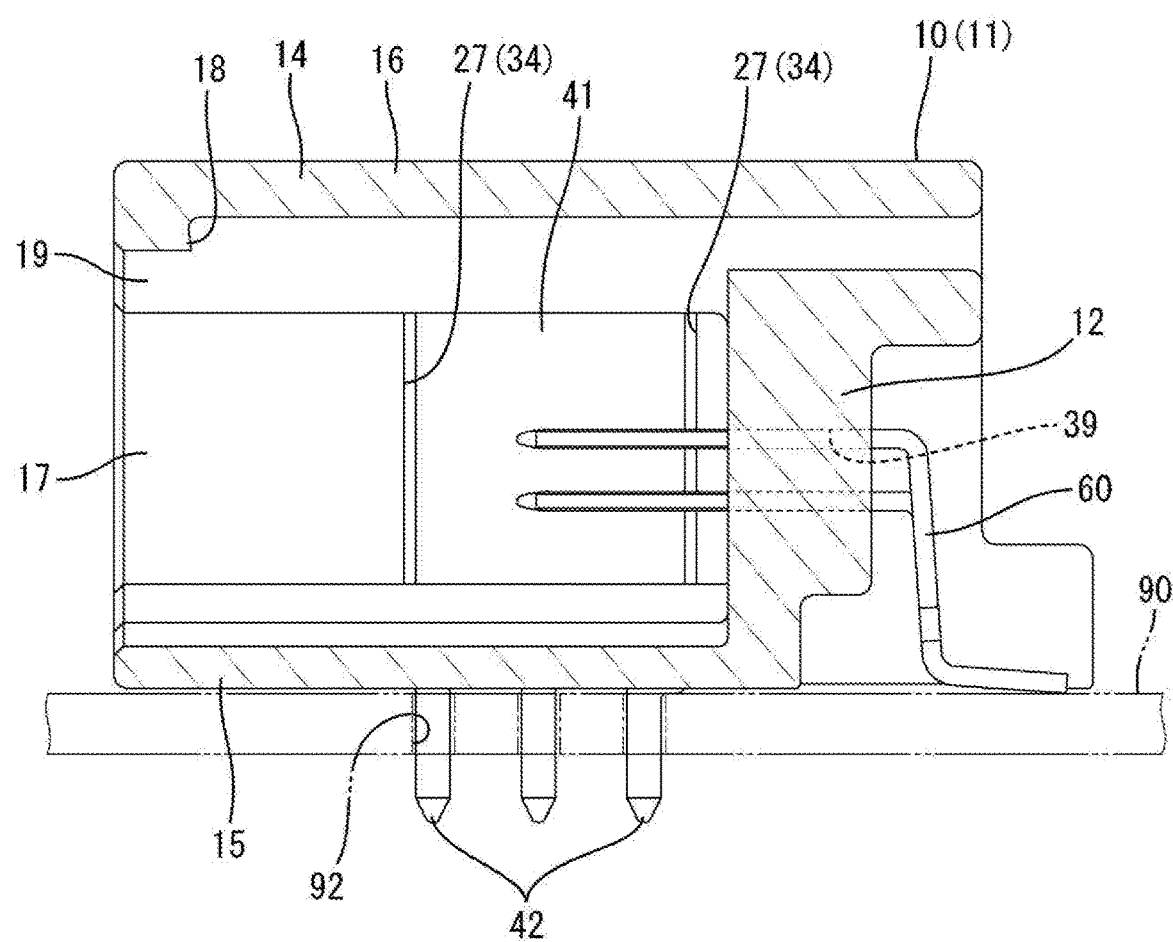
FIG. 7 is a section of a widthwise central part of the board connector.

An embodiment of the invention is described with reference to the drawings. A board connector according to this embodiment is installed on a top plate surface of a circuit board 90 as shown in FIG. 7 and includes terminal fittings 60, a housing 10 and fixing members 40 as shown in FIG. 1. As shown in FIG. 5, the housing 10 is connectable to a mating housing 100. In the following description, a surface side facing the mating housing 100 at the start of connecting the connector to the mating housing 100 is referred to as a front side and a vertical direction is based on respective figures except FIG. 8.

[Terminal Fittings]

The terminal fitting 60 is made of conductive metal and is in the form of a long and narrow pin or tab. The terminal fitting 60 is bent at plural intermediate positions in an extending direction. The terminal fitting 60 is composed of a front part and a rear part extending substantially in a front-rear direction and an intermediate part linking these front and rear parts and extending substantially in the vertical direction. The front part of the terminal fitting 60 is connected electrically to an unillustrated mating terminal fitting mounted in the mating housing 100 at the time of connection to the mating housing 100. The rear part of the terminal fitting 60 is arranged along the plate surface of the circuit board 90 and is connected electrically to a conductive portion of the circuit board 90 by soldering.

[Housing]

Figure 2:
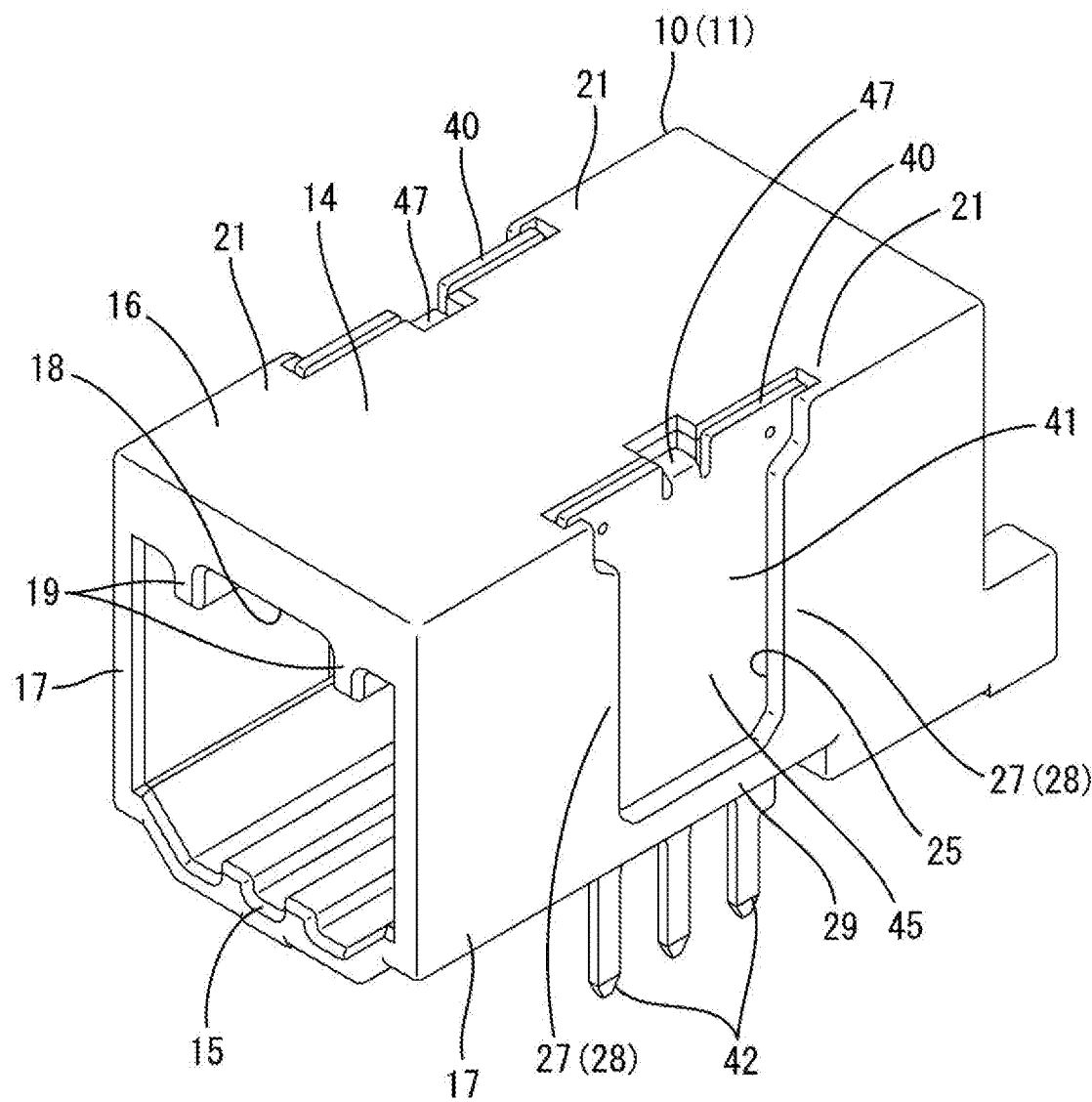
FIG. 2 is a perspective view of the board connector obliquely viewed from an upper-front side.
Figure 3:
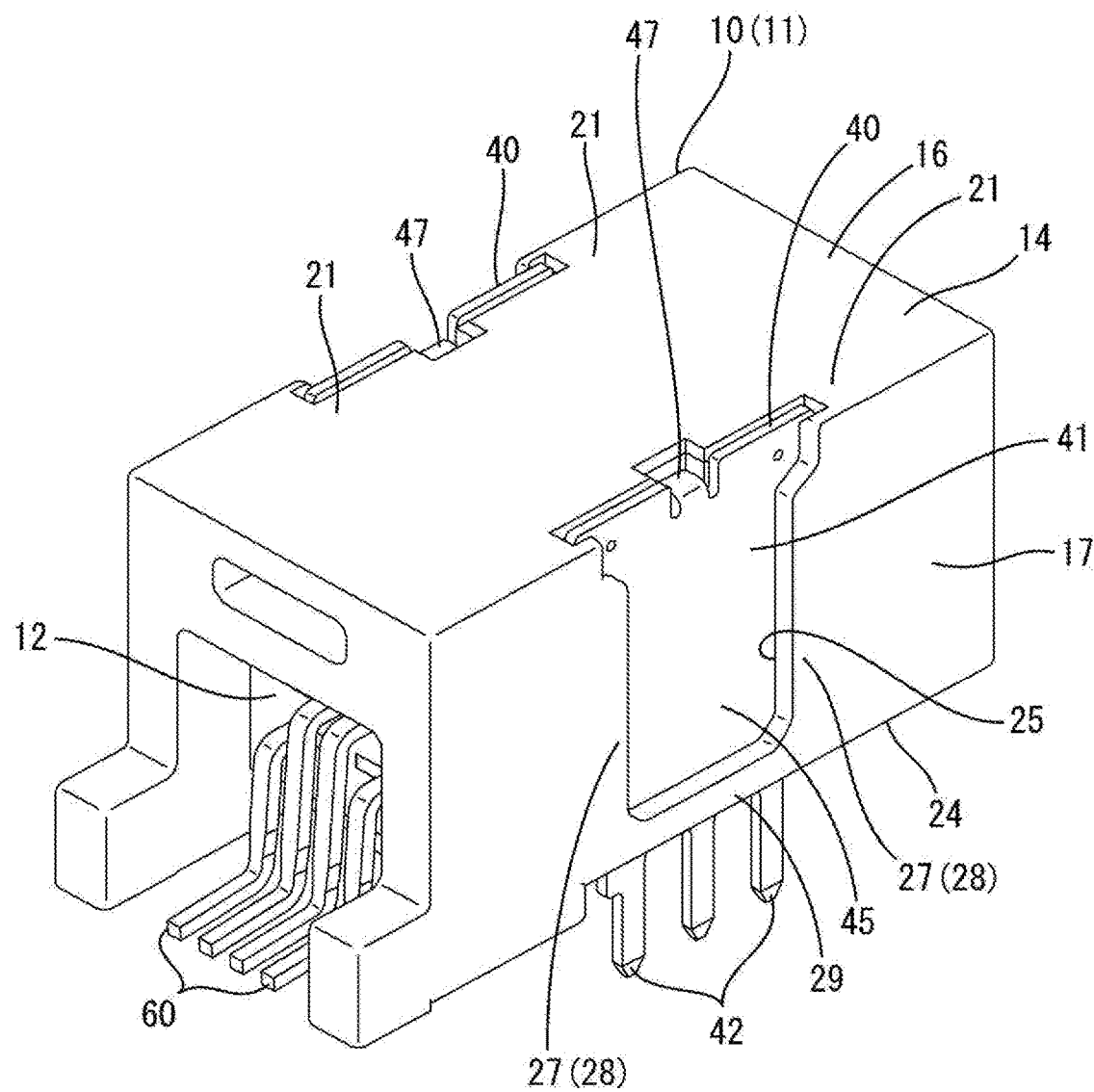
FIG. 3 is a perspective view of the board connector obliquely viewed from an upper-rear side.
Figure 9:
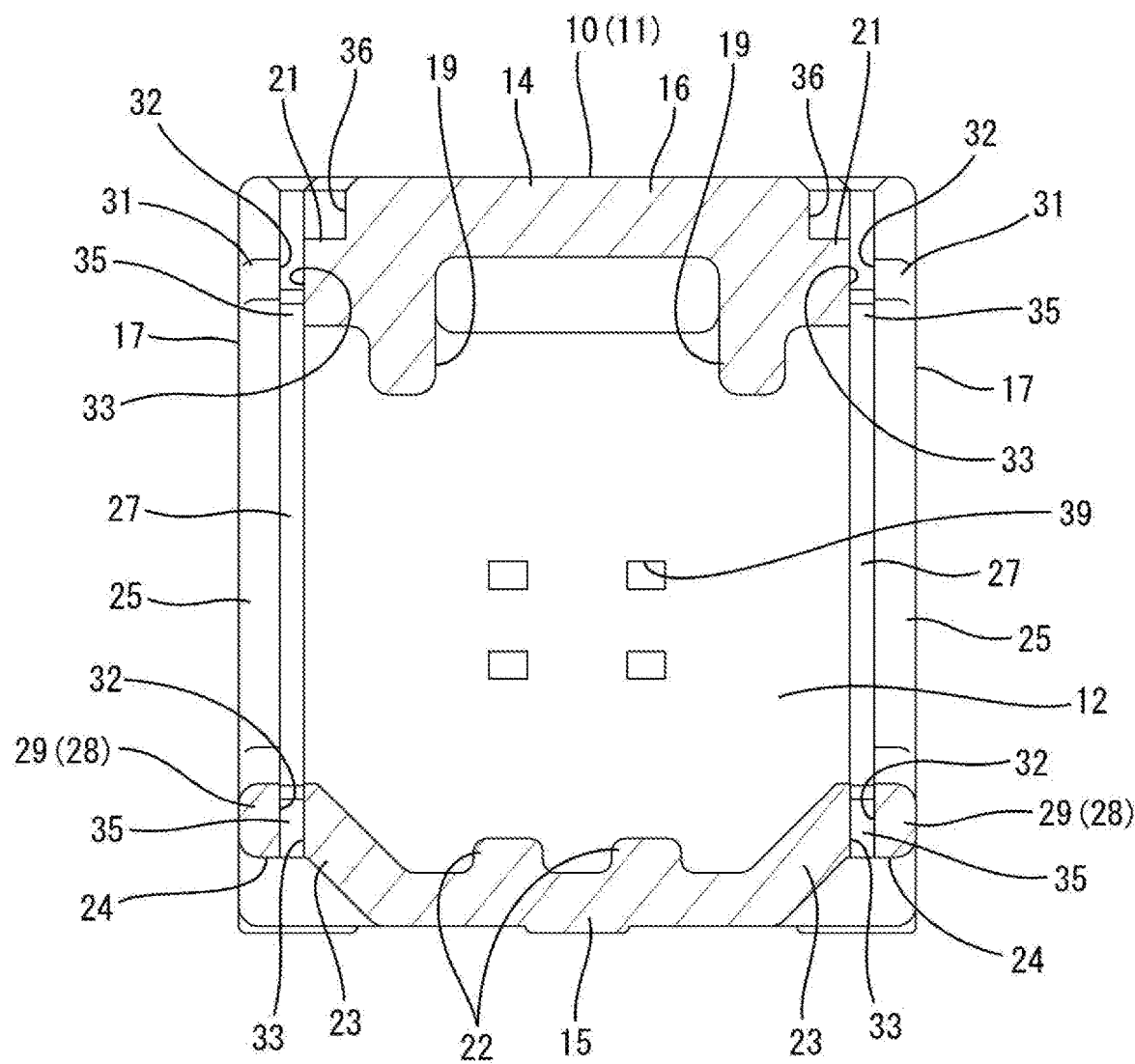
FIG. 9 is a section along B-B of FIG. 8.

The housing 10 is made of synthetic resin and includes, as shown in FIGS. 2 and 3, a receptacle 11 in the form of a forwardly open rectangular tube. The receptacle 11 includes a back wall 12 extending vertically and a fitting 14 projects forward from the outer edge of the back wall 12. As shown in FIG. 9, holes 39 penetrate the back wall 12 in the front-rear direction. As shown in FIG. 7, the terminal fittings 60 are mounted with the front parts press-fit in the respective holes 39 of the back wall 12.

The fitting portion 14 includes a lower wall 15 arranged along the plate surface of the circuit board 90, an upper wall 16 facing the lower wall 15, and two side walls 17 respectively connected to both widthwise ends of the lower and upper walls 15, 16 and arranged along a rising direction from the plate surface of the circuit board 90. As shown in FIG. 5, the outer surfaces of the side walls 17 are flat in the vertical direction.

As shown in FIG. 7, the upper wall 16 of the fitting 14 includes a lock 18 projecting down (inwardly of the receptacle 11) in a widthwise central part of a front part of an inner surface. The lock 18 is in the form of a rib extending in a width direction on the inner surface of the upper wall 16 of the fitting 14 and locks the mating housing 100 fit into the receptacle 11 in a connected state.

The fitting 14 includes thick upper ends 21 including ribs 19 extending in the front-rear direction in parts on both widthwise sides of the upper wall 16 across the lock portion 18 and extending to the side walls 17, as shown in FIG. 9. The upper ends 21 include parts extending in the front-rear direction and overlapping with the lock 18 in a projecting range (height range) thereof.

As shown in FIG. 9, the lower wall 15 of the fitting portion 14 includes a plurality of erroneous connection preventing portions 22 projecting upward (inwardly of the receptacle 11) in a widthwise central part of an inner surface. The plurality of erroneous connection preventing portions 22 are in the form of ribs extending in the front-rear direction and provided side by side in the width direction. As shown in FIG. 5, the respective erroneous connection preventing portions 22 in the form of projections are fit into recessed parts on the outer surface of the mating housing 100 to prevent the mating housing 100 from being connected in a wrong connection posture.

As shown in FIG. 9, the fitting portion 14 includes lower end portions 23 tapered and inclined toward outer sides in the width direction in parts on both widthwise sides of the lower wall 15 across the respective erroneous connection preventing portions 22 and extending to the both side walls 17. The lower end portions 23 include parts extending in the front-rear direction and overlapping with the respective erroneous connection preventing portions 22 in a projecting range (height range) thereof.

Figure 4:
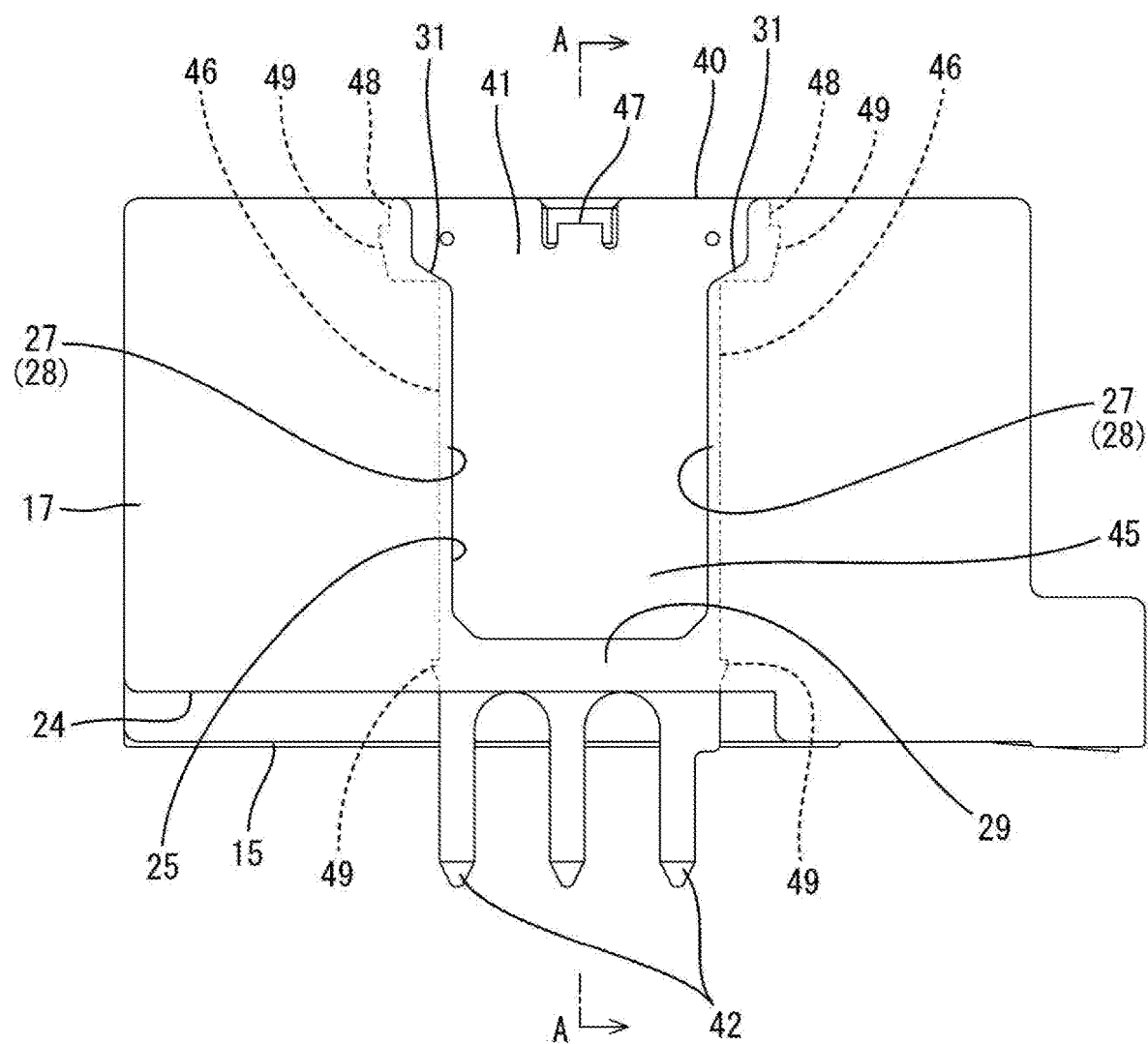
FIG. 4 is a side view of the board connector.

As shown in FIGS. 4 and 9, the lower ends of the both side walls 17 include extending end portions 24 connected to outer end parts of the both lower end portions 23 and extending in the front-rear direction at a position higher than the lower surface of the lower wall 15.

As shown in FIGS. 1 and 9, the fitting portion 14 includes openings 25 penetrating in a wall thickness direction in parts of the both side walls 17 near the back wall 12. The opening 25 is a rectangular opening in a side view, penetrates through the upper wall 16 to be open upward in the form of a slit and penetrates through the extending end portion 24 to be open downward in the form of a slit.

As shown in FIG. 6, the opening 25 includes an expanded part expanded in the front-rear direction in an upper end part and contact stop surfaces 26 extending along the front-rear direction on the lower end of the expanded part. Later-described locking bodies 48 of the fixing member 40 can come into contact with the contact stop surfaces 26 to be stopped.

Figure 8:
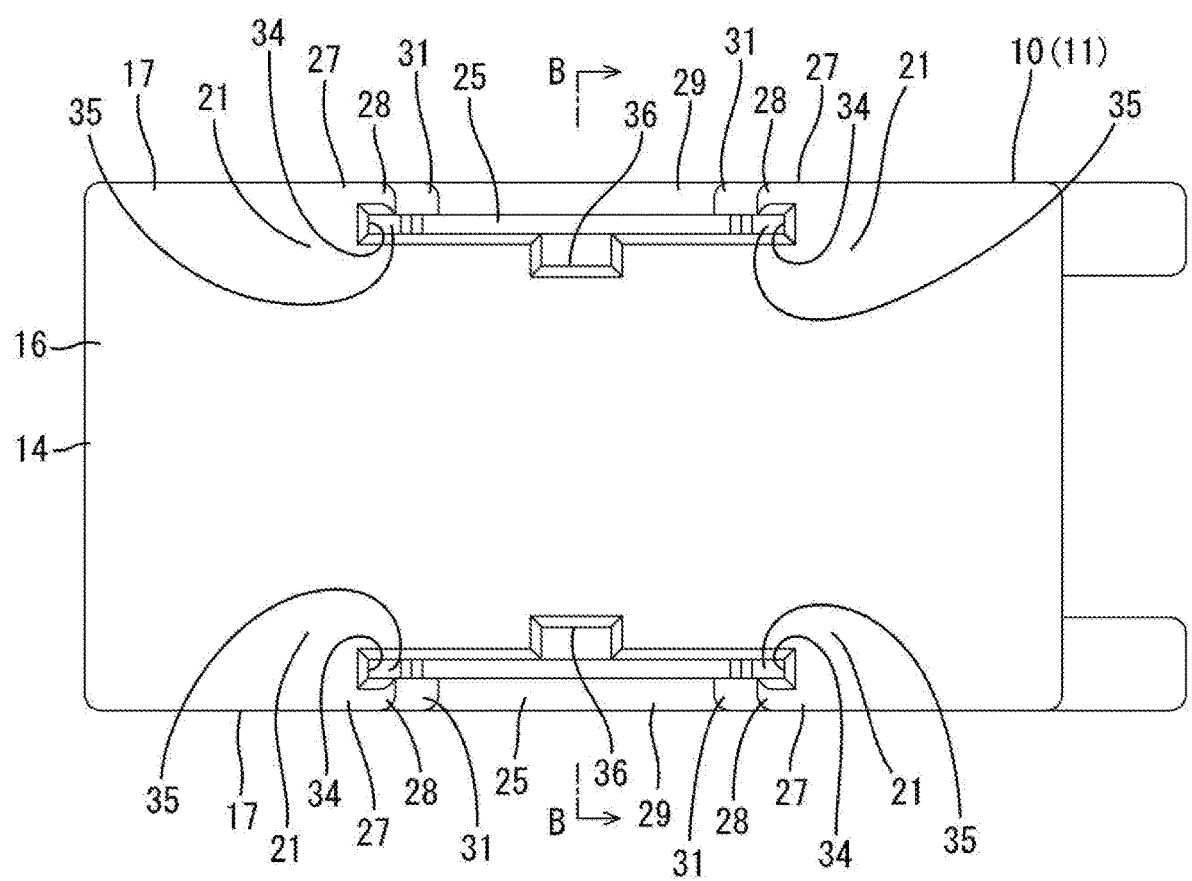
FIG. 8 is a plan view of a housing.

As shown in FIGS. 4 and 8, each of the both side walls 17 includes receiving portions 27 for receiving later-described locking portions 46 of the fixing member 40 on both front and rear side edge parts of the opening 25. The receiving portions 27 include protruding edge portions 28 protruding along an opening surface of the opening 25 from outer sides in a wall thickness direction and are long and narrow in the vertical direction along the both side edge parts.

Further, each of the both side walls 17 includes a bridge-like bridging portion 29 bridged in the width direction between the front and rear protruding edge portions 28 in a lower end part. As shown in FIG. 4, the lower end of the bridging portion 29 constitutes a part of the extending end portion 24 and is continuous with the other part of the extending end portion 24 at the same height in the front-rear direction.

As shown in FIG. 4, the front and rear protruding edge portions 28 include covering walls 31 on sides outward of the expanded part of the opening 25. The covering wall 31 includes an upwardly tapered oblique part. As shown in FIG. 9, inner sides of the covering walls 31 serve as outer side wall surfaces 32 and are facing inner side wall surfaces 33 which are end surfaces of the upper end portions 21.

As shown in FIGS. 8 and 9, the receiving portion 27 includes an upper foreign matter capturing portion 35 in the form of a rectangular recess defined by the outer side wall surface 32 of the covering wall 31, the inner side wall surface 33 of the upper end portion 21 and a back wall surface 34 of the opening 25. Further, as shown in FIG. 9, the receiving portion 27 includes a lower foreign matter capturing portion 35 in the form of a rectangular recess defined by an outer side wall surface 32 on an inner side of the protruding edge portion 28 connected to the bridging portion 29, an inner side wall surface 33 which is an end surface of the lower end portion 23 and the back wall surface 34 of the opening 25. These foreign matter capturing portions 35 can capture shavings (resin dregs) shaved by later-described locking projections 49 of the fixing member 40 as described later. Note that all of the back wall surface 34, the outer side wall surfaces 32 and the inner side wall surfaces 33 are formed to be flat (perpendicular) along the vertical direction.

As shown in FIGS. 8 and 9, the upper wall 16 of the receptacle 11 includes recesses 36 formed by cutting or chamfering at positions facing the openings 25 on both widthwise end parts of an outer surface.

[Fixing Members]

The fixing member 40 is made of metal, in the form of a flat plate as a whole, mounted in the receptacle 11 and arranged along the opening surface of the opening 25. As shown in FIG. 1, two fixing members 40 are provided in the receptacle 11 to respectively correspond to the both side walls 17 and respectively line-symmetrically shaped with respect to a widthwise center of the receptacle 11.

Figure 10:
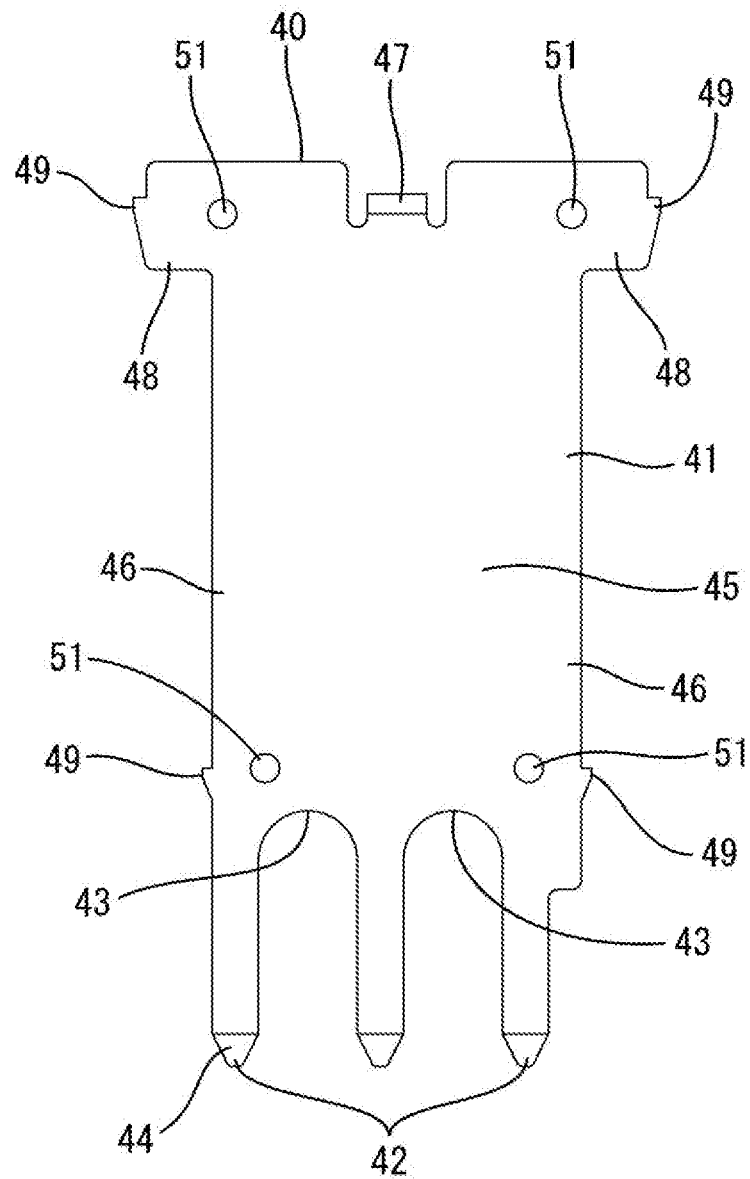
FIG. 10 is a side view of a fixing member.
Figure 11:
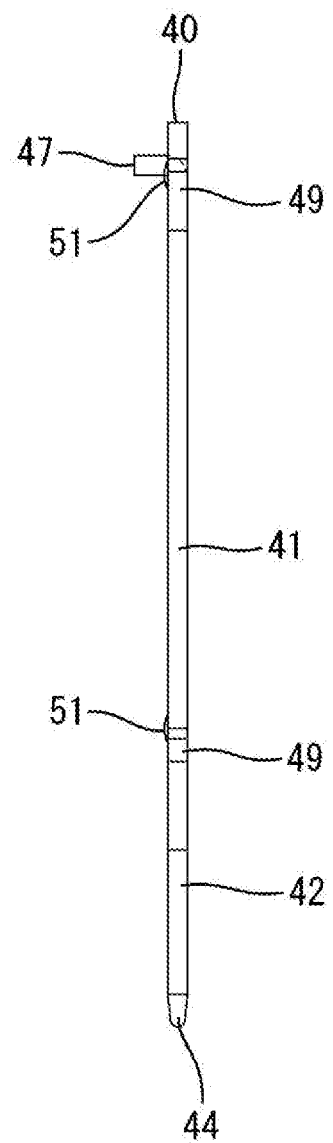
FIG. 11 is a front view of the fixing member.

As shown in FIG. 10, the fixing member 40 includes a receptacle fixing portion 41 substantially in the form of a rectangular plate and a plurality of board fixing portions 42 linearly projecting downward from the lower end of the receptacle fixing portion 41. Three board fixing portions 42 are arranged side by side in the front-rear direction via arcuate portions 43 formed on the lower end of the receptacle fixing portion 41. As shown in FIG. 11, the inner and outer plate surfaces of the fixing member 40 are coplanarly continuous from the receptacle fixing portion 41 to the board fixing portions 42 and are formed to be substantially flat (perpendicular) except at a projecting piece 47 and holding projections 51 to be described later.

As shown in FIG. 10, the respective board fixing portions 42 are in the form of tabs having the same shape and include guiding portions 44 narrowed toward tips on lower end parts. Out of the respective board fixing portions 42, the front end edge of the board fixing portion 42 on a front side is continuous and flush with the front end edge of the receptacle fixing portion 41, and the rear end edge of the board fixing portion 42 on a rear side is connected to the rear end edge of the receptacle fixing portion 41 in a stepped manner.

The receptacle fixing portion 41 includes a covering portion 45 in the form of a flat plate extending in the vertical direction and the locking portions 46 located on both sides of the covering portion 45 in the front-rear direction (plate width direction).

As shown in FIGS. 2 to 4, the covering portion 45 is formed to have a size capable of covering the entire opening surface of the opening 25. The covering portion 45 includes the projecting piece 47 formed by cutting and raising a central part of an upper end edge in the front-rear direction inwardly (toward one side in the plate thickness direction). As shown in FIG. 5, the receptacle fixing portion 41 is arranged along the opening surface of the opening 25 and the projecting piece 47 is inserted into the recess 36, whereby the fixing member 40 is properly mounted in the corresponding side wall 17 out of the both side walls 17. That is, the projecting pieces 47 have a function of structurally identifying the two fixing members 40.

As shown in FIGS. 10 and 11, the covering portion 45 includes a plurality of holding projections 51 on a plate surface on a projecting side of the projecting piece 47. Each holding projection 51 is an arcuately bulging small projection. The respective holding projections 51 closely come into contact with the end surfaces of the upper and lower end portions 21, 23, whereby loose movements of the receptacle fixing portion 41 of the fixing member 40 in the plate thickness direction with respect to the receptacle 11 are restricted.

As shown in FIG. 4, a pair of the locking portions 46 extend along both front and rear side edge parts of the covering portion 45 and are inserted and received into the receiving portions 27 on both front and rear sides across the opening 25 of the side wall 17. As shown in FIGS. 4 and 10, the locking portion 46 includes the locking body 48 projecting from the covering portion 45 in the front-rear direction (plate width direction) in an upper end part. The locking body 48 has a rectangular side view shape and is fit and inserted into the expanded part of the opening 25 as shown in FIG. 6.

As shown in FIG. 10, the locking bodies 48 include the locking projections 49 on both front and rear side edge parts. The locking projections 49 are in the form of claws gradually protruding toward the top. Such locking projections 49 are similarly provided on both front and rear side edge parts on lower end sides of the locking portions 46. As shown in FIG. 6, each locking projection 49 can bite into and be locked to the back wall surface 34 of the receiving portion 27.

[Functions and Effects]

In assembling, the front and rear locking portions 46 of the fixing member 40 are caused to face the front and rear receiving portions 27 of the side wall 17 from above and, in that state, the fixing member 40 is lowered. Then, the locking portions 46 of the fixing member 40 are slid and inserted into the receiving portions 27 in a press-fit state. When the fixing member 40 is properly mounted, the lower ends of the locking bodies 48 are in contact with the contact stop surfaces 26 as shown in FIG. 6 to stop any further inserting operation of the fixing member 40. Further, as shown in FIGS. 2 to 4, the opening surface of the opening 25 of the side wall 17 is closed by the covering portion 45 of the receptacle fixing portion 41 of the fixing member 40. Furthermore, the inner plate surfaces of the locking portions 46 contactably face the respective inner side wall surfaces 33 of the upper and lower end portions 21, 23 and the outer plate surfaces of the locking portions 46 contactably face the respective outer side wall surfaces 32 of the covering portions 31 and the lower protruding edge portions 28 as shown in FIG. 5, and the respective locking projections 49 bite into the back wall surfaces 34 of the corresponding receiving portions 27 as shown in FIG. 6. In this way, the fixing member 40 is retained and fixed in the side wall 17.

As shown in FIG. 6, vertically intermediate parts of the back wall surfaces 34 of the receiving portions 27 are retracted in directions to expand a width of the opening 25 in the front-rear direction with respect to lower end parts, whereby the interference of the back wall surfaces 34 with the respective locking projections 49 on the lower sides of the locking portions 46 can be avoided in the process of sliding the fixing member 40.

Further, in the process of sliding the fixing member 40, the resin of the back wall surfaces 34 of the receiving portions 27 may be shaved by the respective locking projections 49 to produce shavings (resin dregs). However, in the case of this embodiment, even if shavings are produced, the produced shavings can be captured by being sandwiched in an in-out direction in the foreign matter capturing portions 35 (see FIGS. 8 and 9). Particularly, the shavings shaved by the respective locking projections 49 on the upper side are collected on the contact stop surfaces 26 on the inner sides of the covering walls 31, wherefore capture reliability is excellent.

As shown in FIGS. 4 to 6, when the fixing member 40 is fixed in the side wall 17, the upper end of the receptacle fixing portion 41 is arranged substantially at the same height as the upper surface of the upper wall 16 of the receptacle 11 to be exposed on the upper surface of the upper wall 16. As shown in FIG. 4, the respective board fixing portions 42 project downward from the lower end of the bridging portion 29 (extending end portion 24) and can be entirely seen when viewed sideways. A part of the receptacle fixing portion 41 on the side of the board fixing portions 42 has the outer surface covered by the bridging portion 29 and is supported to be able to come into contact with the bridging portion 29. Thus, an outward (separating direction from the opening surface of the opening 25) lifting movement of the part of the receptacle fixing portion 41 on the side of the board fixing portions 42 is restricted, and this part is stably fixed in the side wall 17.

Thereafter, the receptacle 11 is placed on the plate surface of the circuit board 90. Then, as shown in FIG. 7, the respective terminal fittings 60 are arranged along the conductive portions of the circuit board 90 and the respective board fixing portions 42 of the both fixing members 40 are guided by the guiding portions 44 and arranged through fixing holes 92 provided in the circuit board 90. Here, paste solder is applied to the respective conductive portions and the respective fixing holes 92 in advance. In that state, reflow soldering is performed, whereby the respective terminal fittings 60 are connected to the corresponding conductive portions and the respective board fixing portions 42 of the both fixing members 40 are fixed to the circuit board 90.

As described above, according to this embodiment, the openings 25 penetrate through the side walls 17 in the wall thickness direction. Thus, manufacturing is easier as compared to the case where thin parts remain in the side walls 17. Further, since mounting parts for the fixing members 40 in the receptacle 11 do not laterally project from the side walls 17, the enlargement of the receptacle 11 in the width direction can be avoided. Furthermore, since the receptacle fixing portions 41 of the fixing members 40 are arranged along the opening surfaces of the openings 25 and do not laterally project from the side walls 17, the enlargement of the entire board connector in the width direction can be avoided. In addition, since the fixing members 40 are formed to extend linearly and continuously from the receptacle fixing portions 41 to the board fixing portions 42, an occupying area of the board connector on the plate surface of the circuit board 90 can be made smaller as compared to the case where the board fixing portions 42 laterally protrude.

Further, since the covering portions 45 of the fixing members 40 cover the opening surfaces of the openings 25, the intrusion of foreign matters into the receptacle 11 through the openings 25 can be prevented. In this case, even if the openings 25 are open in the side walls 17, the locking portions 46 of the fixing members 40 are locked to the receiving portions 27 on both front and rear sides across the openings 25, wherefore locking structures for the fixing members 40 can be reliably formed in the receiving portions 27.

Furthermore, since the receiving portions 27 include the foreign matter capturing portions 35 each defined into a recess by the inner side wall surface 33, the outer side wall surface 32 and the back wall surface 34, foreign matters such as shavings shaved by the locking projections 49 can be captured by the foreign matter capturing portions 35 and the intrusion of foreign matters into the receptacle 11 can be prevented. In this case, since the inner side wall surfaces 33 of the foreign matter capturing portions 35 constitute the end surfaces of the upper end portions 21 and the upper end portions 21 are provided on both widthwise sides across the lock portion 18 when viewed from front, spaces on the both widthwise sides across the lock portion 18 (particularly, spaces corresponding to a height of the lock portion 18) can be effectively utilized as the foreign matter capturing portions 35. Similarly, since the inner side wall surfaces 33 of the foreign matter capturing portions 35 constitute the end surfaces of the lower end portions 23 and the lower end portions 23 are provided on both widthwise sides across the respective erroneous connection preventing portions 22, spaces on the both widthwise sides across the erroneous connection preventing portions 22 (particularly, spaces corresponding to a height of the respective erroneous connection preventing portions 22) can be effectively utilized as the foreign matter capturing portions 35. As a result, the receptacle 11 is excellent in space efficiency and, in addition, a degree of freedom in forming the foreign matter capturing portions 35 can be enhanced.

Furthermore, since the bridging portion 29 is bridged between the both front and rear side edge parts of the opening 25 in the side wall 17 and can come into contact with the outer surface of the covering portion 45 of the receptacle fixing portion 41, an outward lifting movement of the receptacle fixing portion 41 can be prevented and a predetermined strength can be imparted to the side wall 17. In addition, since the bridging portion 29 is provided on the lower end part of the side wall 17 on the side of the circuit board 90 and can come into contact with the part of the receptacle fixing portion 41 on the side of the board fixing portions 42, the part of the receptacle fixing portion 41 on the side of the board fixing portions 42 can be more stably supported by the bridging portion 29 and the board fixing portions 42 can be fixed to the circuit board 90 with enhanced reliability.

Other embodiments are briefly described below.

The board fixing portions may be bent and connected to the receptacle fixing portion and fixed along the plate surface of the circuit board. In this case, the fixing member may be L-shaped in a front view.

One or two board fixing portions may be provided on the fixing member or four or more board fixing portions may be provided on the fixing member.

The terminal fitting may be L-shaped and may have a horizontal part and a vertical part. The vertical part may be connected through a connection hole of the circuit board. The horizontal part (front part in the embodiment) of the terminal fitting may be inserted and mounted in the back wall of the receptacle.

The receptacle fixing portion of the fixing member may partially leave an opening part without covering the entire opening surface of the opening.

LIST OF REFERENCE SIGNS

11 . . . receptacle
17 . . . side wall
18 . . . lock
21 . . . upper end
22 . . . erroneous connection preventing portion
25 . . . opening 27 . . . receiving portion
29 . . . bridge
32 . . . outer side wall surface
33 . . . inner side wall surface
34 . . . back wall surface
35 . . . foreign matter capturing portion
40 . . . fixing member
41 . . . receptacle fixing portion
42 . . . board fixing portion
45 . . . cover
46 . . . locking portion
60 . . . terminal fitting
90 . . . circuit board
100 . . . mating housing

What is claimed is:

1. A board connector, comprising:
a tubular receptacle fittable to a mating housing, the receptacle including a lower wall configured to be positioned on a plate surface of a circuit board, a side wall extending from the lower wall along a rising direction from the plate surface of the circuit board, an upper wall opposed to the lower wall and extending from an upper end of the side wall, a side wall opening penetrating the side wall in a wall thickness direction, and upper and lower wall openings penetrating through areas of the upper and lower walls adjacent the side wall and communicating with the side wall opening; and
a fixing member including a board fixing portion passing through the lower wall opening and to be fixed to the circuit board and a receptacle fixing portion connected to the board fixing portion and to be fixed to the receptacle in a state arranged so that peripheral edge regions of the receptacle fixing portion are disposed along an inner surface of the side wall adjacent the side wall opening so that an intermediate part of the receptacle fixing portion closes the side wall opening.

2. The board connector of claim 1, wherein the side wall is provided with a bridge that bridges between both side edges of the opening and configured for contacting an outer surface of the receptacle fixing portion.

3. The board connector of claim 2, wherein the bridge is provided on a lower end part of the side wall and contacts a part of the receptacle fixing portion in proximity to the circuit board.

4. The board connector of claim 1, wherein the fixing member extends linearly and continuously from the receptacle fixing portion to the board fixing portion.

5. The board connector of claim 1, wherein an upper part of the receptacle fixing portion is disposed in the upper wall opening.

6. The board connector of claim 1, wherein the side wall is a first side wall, and the tubular receptacle further comprises a second side wall opposed to the first side wall and extending between the upper and lower walls, a second side wall opening penetrating the second side wall in a wall thickness direction, a second upper wall opening and a second lower wall opening penetrating through areas of the upper and lower walls adjacent the second side wall and communicating with the second side wall opening, and a second fixing member including a second board fixing portion passing through the second lower wall opening and to be fixed to the circuit board and a second receptacle fixing portion connected to the second board fixing portion and to be fixed to the receptacle in a state arranged so that peripheral edge regions of the second receptacle fixing portion are disposed along an inner surface of the second side wall adjacent the second side wall opening so that an intermediate part of the receptacle fixing portion closes the side wall opening.

7. A board connector, comprising:
a tubular receptacle fittable to a mating housing, the receptacle including a side wall extending along a rising direction from a plate surface of a circuit board, an opening penetrating the side wall in a wall thickness direction; and
a fixing member including a board fixing portion to be fixed to the circuit board and a receptacle fixing portion connected to the board fixing portion and to be fixed to the receptacle in a state arranged along an opening surface of the opening, wherein:
the receptacle has receiving portions on both sides of the opening; and
the receptacle fixing portion includes a cover in the form of a flat plate covering the opening and locks located on both sides of the cover in a plate width direction and to be locked to the receiving portions.

8. The board connector of claim 7, wherein:
each of the locks includes a locking projection; and
each of the receiving portions includes a foreign matter capturing portion defining a recess with a back surface configured so that the locking projection bites therein, an inner side wall surface covering an inner plate surface of the lock and an outer side wall surface covering an outer plate surface of the lock.

9. The board connector of claim 8, wherein the receptacle includes an upper wall connected to a tip part in the rising direction of the side wall, a lock projecting in from the upper wall and configured for holding the mating housing in a connected state, and the foreign matter capturing portions of the receiving portions are provided on both sides across the lock.

10. The board connector of claim 8, wherein the receptacle includes a lower wall connected to a base ends in the rising direction of the side walls, an erroneous connection preventing portion projecting inward on the lower wall and configured for preventing erroneous connection to the mating housing, and the foreign matter capturing portions of the receiving portions are provided on both sides across the erroneous connection preventing portion.

* * * * *